(12) United States Patent
Zhou

(10) Patent No.: US 10,516,126 B2
(45) Date of Patent: Dec. 24, 2019

(54) QUANTUM DOT ELECTROLUMINESCENT DEVICE AND METHOD OF MANUFACTURING THE SAME

(71) Applicant: Shenzhen China Star Optoelectronics Technology Co., Ltd., Shenzhen, Guangdong (CN)

(72) Inventor: Kaifeng Zhou, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 41 days.

(21) Appl. No.: 15/569,705

(22) PCT Filed: Jul. 13, 2017

(86) PCT No.: PCT/CN2017/092711
§ 371 (c)(1),
(2) Date: Oct. 26, 2017

(87) PCT Pub. No.: WO2019/000492
PCT Pub. Date: Jan. 3, 2019

(65) Prior Publication Data
US 2019/0051849 A1  Feb. 14, 2019

(30) Foreign Application Priority Data

Jun. 28, 2017 (CN) .......................... 2017 1 0505477

(51) Int. Cl.
*H01L 51/50* (2006.01)
*H01L 51/56* (2006.01)

(52) U.S. Cl.
CPC ........ *H01L 51/502* (2013.01); *H01L 51/5004* (2013.01); *H01L 51/508* (2013.01); *H01L 51/5064* (2013.01); *H01L 51/56* (2013.01)

(58) Field of Classification Search
CPC .............. H01L 51/5064; H01L 51/508; H01L 51/5076; H01L 51/506; H01L 51/5052
See application file for complete search history.

(56) References Cited

U.S. PATENT DOCUMENTS

2016/0027848 A1   1/2016  Liu et al.
2018/0269419 A1*  9/2018  Tu ...................... H01L 51/5056
2018/0346748 A1* 12/2018  Pan ......................... C09D 11/52

FOREIGN PATENT DOCUMENTS

CN    104112766 A    10/2014
CN    105449112 A     3/2016
(Continued)

*Primary Examiner* — Thanhha S Pham
(74) *Attorney, Agent, or Firm* — Mintz Levin Cohn Ferris Glovsky and Popeo, P.C.; Jhongwoo Peck

(57) ABSTRACT

The present disclosure provides a quantum dot electroluminescent device, which includes: a substrate; an anode disposed on the substrate; a hole transmission layer disposed on the anode; a quantum dot luminescent layer disposed on the hole transmission layer; an electron transmission layer disposed on the quantum dot luminescent layer; and a cathode disposed on the electron transmission layer, wherein the hole transmission layer is a P-type doped hole transmission layer and/or the electron transmission layer is a N-type doped electron transmission layer. The present disclosure further provides a method of manufacturing the quantum dot electroluminescent device. The present disclosure causes degrees of curvature of interfacial energy bands to be different by forming a gradient doping effect in a multi-layer hole transmission layer, so as to form a gradient energy level, that is, the HOMO energy level deepens in order from the anode to the quantum dot luminescent layer, thereby reducing the energy barrier of the holes being injected from the anode to the quantum dot luminescent layer to improve the luminescent efficiency of the device.

4 Claims, 6 Drawing Sheets

(56) References Cited

FOREIGN PATENT DOCUMENTS

| CN | 105552244 A | 5/2016 |
| CN | 105684555 A | 6/2016 |
| CN | 105845834 A | 8/2016 |
| CN | 106601919 A | 4/2017 |
| CN | 106654026 A | 5/2017 |

* cited by examiner

US 10,516,126 B2

QUANTUM DOT ELECTROLUMINESCENT DEVICE AND METHOD OF MANUFACTURING THE SAME

CROSS-REFERENCES TO RELATED APPLICATIONS

This application is a U.S. national phase application, pursuant to 35 U.S.C. § 371, of PCT/CN2017/092711, filed Jul. 13, 2017, designating the United States, which claims priority to Chinese Application No. 201710505477.9, filed Jun. 28, 2017. The entire contents of the aforementioned patent applications are incorporated herein by this reference.

TECHNICAL FIELD

The present disclosure belongs to an electroluminescent technical field, and specifically, relates to a quantum dot electroluminescent device and a method of manufacturing the same.

BACKGROUND ART

A quantum dot electroluminescent device (QLED), like an organic light emitting device (OLED), may actively emit light and has advantages of a fast response speed, wide angle of view, light weight, low power consumption and the like; meanwhile, compared with the OLED, the QLED has a higher color purity and may implement a wider color gamut when being applied to a display device. A quantum dot material may easily dissolve in a variety of solvents by changing surface ligands, and is very suitable for a low cost solution processing technology.

At present, there is a larger gap between a luminescent efficiency of the QLED and that of the OLED, wherein on the one hand, because a material of a QD (quantum dot) luminescent layer in the QLED is prepared by a solution method, the material has more defective states in itself, so as to reduce the luminescent efficiency of the material; on the other hand, in a device structure design, in order to obtain a device with a high efficiency, it is necessary to balance a carrier concentration injected in the luminescent layer. In the OLED design, since an energy level of the luminescent layer material is moderate, a variety of functional layer materials may be selected to match the energy level thereof (an energy barrier <0.3 eV), which may implement the efficient carrier injection and balance. However, in the QLED design, since the QD material has a deeper HOMO (highest occupied molecular orbital) energy level, there is a larger energy barrier (>1 eV) between a hole transmission material and the HOMO energy level of the QD material, while an electron injection hardly has the energy barrier, thereby causing a serious imbalance between the electrons and the holes, and reducing the luminescent efficiency of the device.

SUMMARY

In order to resolve the above problem existing in the prior art, a purpose of the present disclosure lies in providing a quantum dot electroluminescent device that may improve a luminescent efficiency and a method manufacturing the same.

According to one aspect of the present disclosure, a quantum dot electroluminescent device is provided, which includes: a substrate; an anode disposed on the substrate; a hole transmission layer disposed on the anode; a quantum dot luminescent layer disposed on the hole transmission layer; an electron transmission layer disposed on the quantum dot luminescent layer; and a cathode disposed on the electron transmission layer, wherein the hole transmission layer is a P-type doped hole transmission layer and/or the electron transmission layer is a N-type doped electron transmission layer.

Optionally, when the hole transmission layer is a P-type doped hole transmission layer, a number of layers of the hole transmission layer is at least two, and a doping concentration of the hole transmission layer gradually increases along a direction away from the anode.

Optionally, when the electron transmission layer is a N-type doped electron transmission layer, a number of layers of the electron transmission layer is at least two, and a doping concentration of the electron transmission layer gradually increases along a direction away from the anode.

According to another aspect of the present disclosure, a method of manufacturing a quantum dot electroluminescent device is further provided, which includes: providing a substrate; manufacturing and forming an anode on the substrate; manufacturing and forming a hole transmission layer on the anode; manufacturing and forming a quantum dot luminescent layer on the hole transmission layer; manufacturing and forming an electron transmission layer on the quantum dot luminescent layer; and manufacturing and forming a cathode on the electron transmission layer, wherein the hole transmission layer is a P-type doped hole transmission layer and/or the electron transmission layer is a N-type doped electron transmission layer.

Optionally, when the hole transmission layer is a P-type doped hole transmission layer, the manufacturing and forming the hole transmission layer on the anode includes: manufacturing and forming at least two layers of the hole transmission layer sequentially on the anode; and performing a P-type doping on the hole transmission layer; wherein a doping concentration of the hole transmission layer gradually increases along a direction away from the anode.

Optionally, when the electron transmission layer is a N-type doped electron transmission layer, the manufacturing and forming the electron transmission layer on the quantum dot luminescent layer includes: manufacturing and forming at least two layers of the electron transmission layer sequentially on the quantum dot luminescent layer; and performing a N-type doping on the electron transmission layer, wherein a doping concentration of the electron transmission layer gradually increases along a direction away from the anode.

Optionally, a material of the hole transmission layer is polytetraphenylbenzidine or polyvinylcarbazole, and a P-type doped material in the hole transmission layer is F4-TCNQ (2,3,5,6-Tetrafluoro-7,7',8,8'-Tetracyanoquinodimethane) or HAT-CN (2,3,6,7,10,11-Hexacyano-1,4,5,8,9,12-hexaazatriphenylene) or $MoO_3$.

Optionally, a material of the electron transmission layer is, and a N-type doped material in the electron transmission layer is.

The advantageous effects of the present disclosure are as follows: the present disclosure causes degrees of curvature of interfacial energy bands to be different by forming a gradient doping effect in a multi-layer hole transmission layer, so as to form a gradient energy level, that is, the HOMO energy levels deepen sequentially from the anode to the quantum dot luminescent layer, thereby reducing the energy barrier of the holes being injected from the anode to the quantum dot luminescent layer to improve the luminescent efficiency of the device.

BRIEF DESCRIPTION OF THE DRAWINGS

The above and other aspects, features and advantages of embodiments of the present disclosure will become clearer by the following description performed in conjunction with the drawings, in which.

DETAILED DESCRIPTION OF EXEMPLARY EMBODIMENTS

Figure 1A:
FIGS. 1A to 1F are process diagrams of a method of manufacturing a quantum dot electroluminescent device according to a first embodiment of the present disclosure.

Embodiments of the present disclosure will be described in detail below by referring to the drawings. However, the present disclosure may be implemented in numerous different forms, and the present disclosure should not be explained to be limited to the specific embodiments described herein. Instead, these embodiments are provided for explaining principles and actual applications of the present disclosure, so that other skilled in the art may understand various embodiments and various amendments suitable for specific intended applications of the present disclosure.

In the drawings, for the sake of clarity, shapes and sizes of components may be exaggerated, and the same numerals will throughout be used to denote the same or similar components.

FIGS. 1A to 1F are process diagrams of a method of manufacturing a quantum dot electroluminescent device according to a first embodiment of the present disclosure.

The method of manufacturing the quantum dot electroluminescent device according to the first embodiment of the present disclosure includes the following steps.

Step 1: providing a substrate 100 by referring to FIG. 1A. The substrate 100 may be a hard substrate, such as a transparent hard glass substrate or a transparent hard resin substrate, and may also be a flexible substrate here.

Figure 1B:
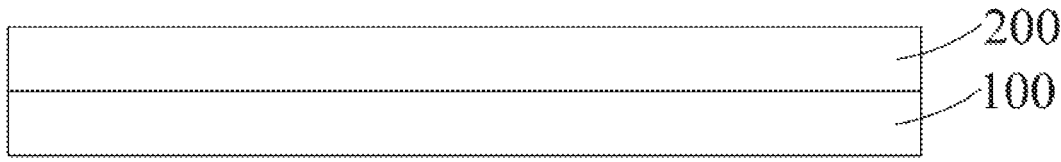

Step 2: manufacturing and forming an anode 200 on the substrate by referring to FIG. 1B. Here, the anode 200 may be transparent or semi-transparent or non-transparent, which is determined according to a direction of light emission. If the light is emitted from a side of a cathode 600, the anode 200 is non-transparent and may reflect the light; and if the light is emitted from a side of the anode 200, the anode 200 is transparent or semi-transparent.

Figure 1C:
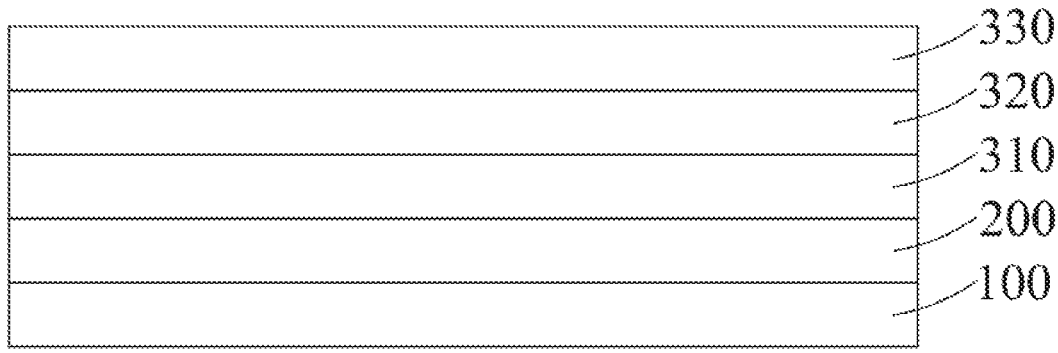

Step 3: manufacturing and forming three layers of hole transmission layers on the anode 200, namely, a first hole transmission layer 310, a second hole transmission layer 320, and a third hole transmission layer 330 respectively from bottom to top by referring to FIG. 1C. It should be explained that the number of layers of the hole transmission layers is not limited to three layers, and may further be two layers or more layers in the present disclosure.

The P-type doping is performed on the first hole transmission layer 310, the second hole transmission layer 320, and the third hole transmission layer 330, and doping concentrations of the first hole transmission layer 310, the second hole transmission layer 320 and the third hole transmission layer 330 increase sequentially along a direction away from the anode 200.

Furthermore, a manufacturing material of the first hole transmission layer 310, the second hole transmission layer 320, and the third hole transmission layer 330 may be, for example, polytetraphenylbenzidine or polyvinylcarbazole, but the present disclosure is not limited thereto. In addition, a doping material for performing a P-type doping may be, for example, F4-TCNQ (2,3,5,6-Tetrafluoro-7,7',8,8'-Tetracyanoquino-dimethane) or HAT-CN (2,3,6,7,10,11-Hexacyano-1,4,5,8,9,12-hexaazatriphenylene) or Molybdenum trioxide ($MoO_3$), but the present disclosure is not limited thereto.

Figure 1D:
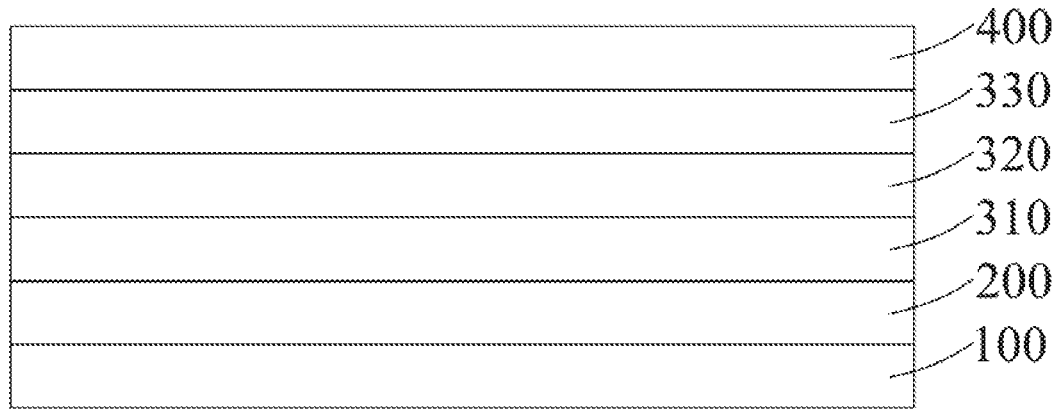

Step 4: manufacturing and forming a quantum dot luminescent layer 400 on the third hole transmission layer 330 by referring to FIG. 1D. The quantum dot luminescent layer 400 is used to generate and emit the light.

Figure 1E:
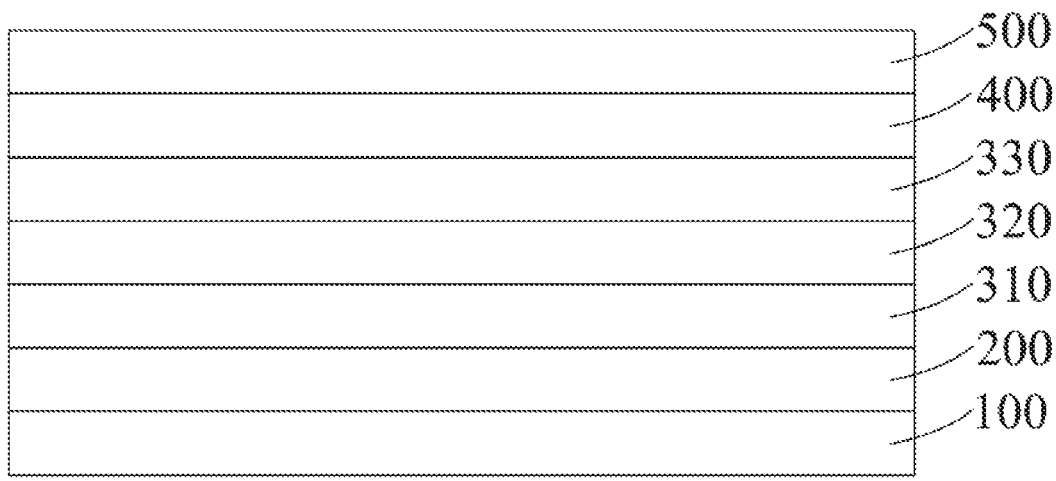

Step 5: manufacturing and forming an electron transmission layer 500 on the quantum dot luminescent layer 400 by referring to FIG. 1E.

Figure 1F:
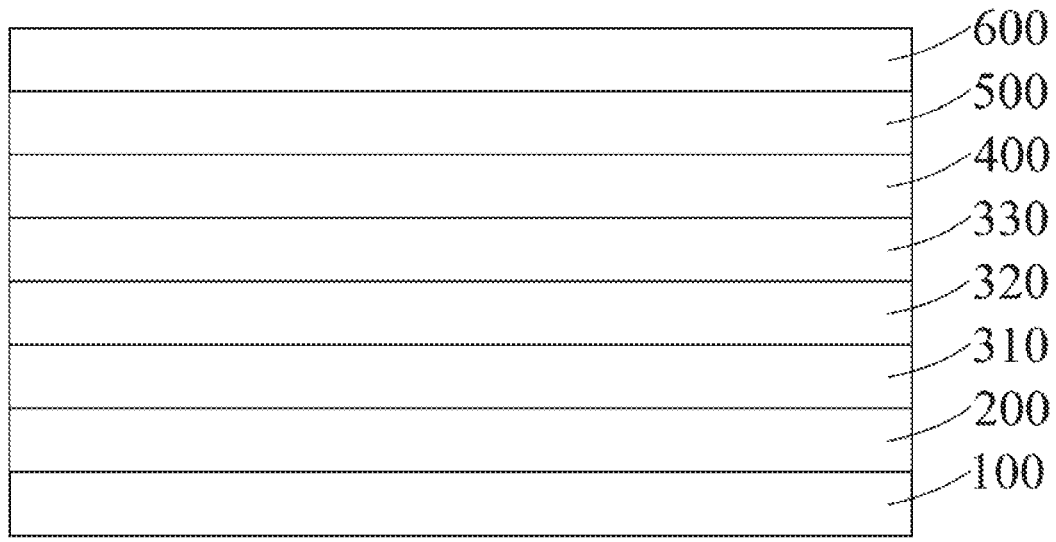

Step 6: manufacturing and forming a cathode 600 on the electron transmission layer 500 by referring to FIG. 1F. The cathode 600 may be transparent or semi-transparent or non-transparent, which is determined according to the direction of light emission here. If the light is emitted from the side of the anode 200, the cathode 600 is non-transparent and may reflect the light; and if the light is emitted from the side of the cathode 600, the cathode 600 is transparent or semi-transparent.

As above, by performing the gradient P-type doping on the first hole transmission layer 310, the second hole transmission layer 320, and the third hole transmission layer 330, the gradient doping effect is formed and the degrees of the curvature of interfacial energy bands are caused to be different, thereby forming the gradient energy levels (that is, the HOMO energy levels deepen orderly from the anode 200 to the quantum dot luminescent layer 400), and further reducing the energy barrier of the holes being injected from the anode 200 to the quantum dot luminescent layer 400 to improve the luminescent efficiency of the device.

FIGS. 2A to 2F are process diagrams of a method of manufacturing a quantum dot electroluminescent device according to a second embodiment of the present disclosure.

The method of manufacturing the quantum dot electroluminescent device according to the second embodiment of the present disclosure includes as follows.

Figure 2A:
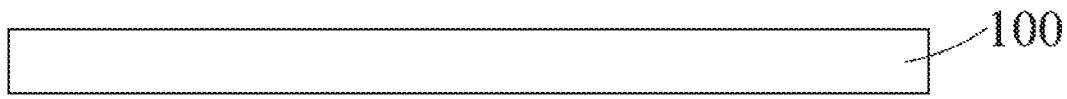
FIGS. 2A to 2F are process diagrams of a method of manufacturing a quantum dot electroluminescent device according to a second embodiment of the present disclosure.

Step 1: providing a substrate 100 by referring to FIG. 2A. The substrate 100 may be a hard substrate, such as a transparent hard glass substrate or a transparent hard resin substrate, and may also be a flexible substrate here.

Figure 2B:
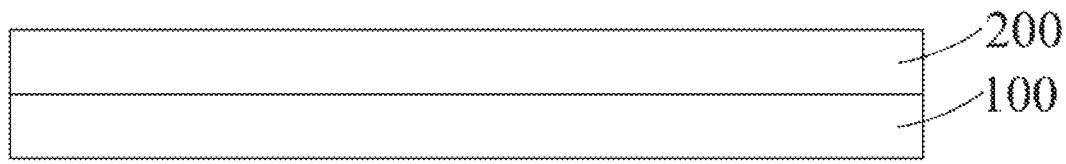

Step 2: manufacturing and forming an anode 200 on the substrate by referring to FIG. 2B. Here, the anode 200 may be transparent or semi-transparent or non-transparent, which is determined according to a direction of light emission. If the light is emitted from a side of a cathode 600, the anode 200 is non-transparent and may reflect the light; and if the light is emitted from a side of the anode 200, the anode 200 is transparent or semi-transparent.

Figure 2C:
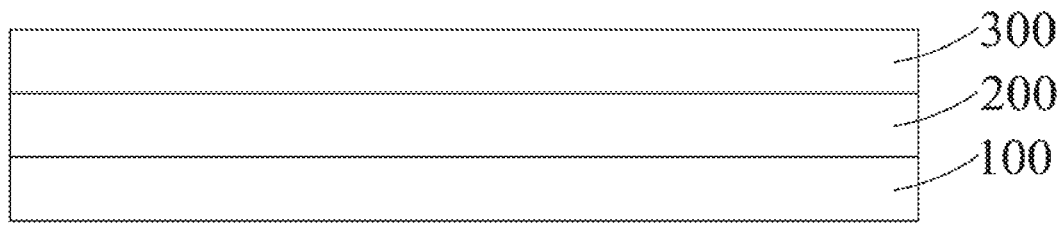

Step 3: manufacturing and forming a hole transmission layer 300 on the anode 200 by referring to FIG. 2C. A manufacturing material of the hole transmission layer 300 may be such as polytetraphenylbenzidine or polyvinylcarbazole, but the present disclosure is not limited thereto.

Figure 2D:
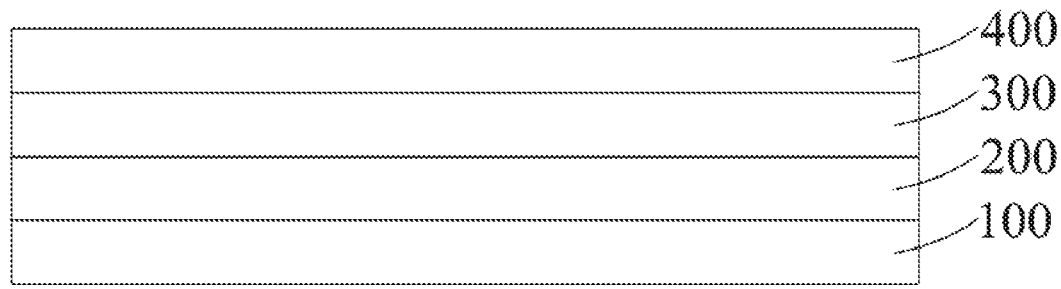

Step 4: manufacturing and forming a quantum dot luminescent layer 400 on the hole transmission layer 300 by referring to FIG. 2D. The quantum dot luminescent layer 400 is used to generate and emit the light.

Figure 2E:
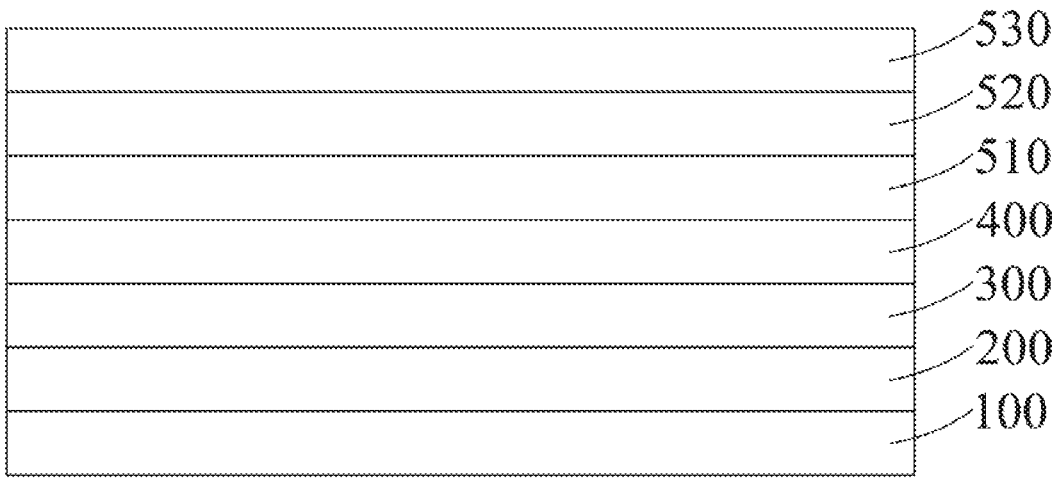

Step 5: manufacturing and forming three layers of electron transmission layers on the quantum dot luminescent layer 400, namely, a first electron transmission layer 510, a second electron transmission layer 520, and a third electron transmission layer 530 respectively from bottom to top by referring to FIG. 2E. It should be explained that the number of layers of the electron transmission layers is not limited to three layers, and may further be two layers or more layers in the present disclosure.

The N-type doping is performed on the first electron transmission layer 510, the second electron transmission layer 520, and the third electron transmission layer 530, and the doping concentrations of the first electron transmission layer 510, the second electron transmission layer 520 and the third electron transmission layer 530 sequentially increase along a direction away from the quantum dot luminescent layer 400.

Figure 2F:
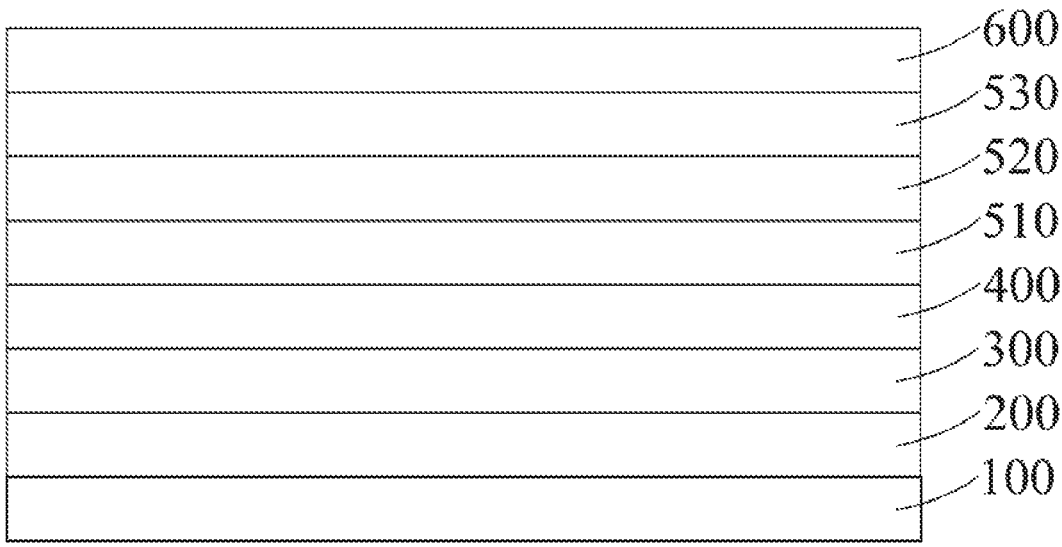

Step 6: manufacturing and forming a cathode 600 on the third electron transmission layer 530 by referring to FIG. 2F. The cathode 600 may be transparent or semi-transparent or non-transparent, which is determined according to the direction of light emission here. If the light is emitted from the side of the anode 200, the cathode 600 is non-transparent and may reflect the light; and if the light is emitted from the side of the cathode 600, the cathode 600 is transparent or semi-transparent.

FIGS. 3A to 3F are process diagrams of a method of manufacturing a quantum dot electroluminescent device according to a third embodiment of the present disclosure.

The method of manufacturing the quantum dot electroluminescent device according to the third embodiment of the present disclosure includes as follows.

Figure 3A:
FIGS. 3A to 3F are process diagrams of a method of manufacturing a quantum dot electroluminescent device according to a third embodiment of the present disclosure.

Step 1: providing a substrate 100 by referring to FIG. 3A. The substrate 100 may be a hard substrate, such as a transparent hard glass substrate or a transparent hard resin substrate, and may also be a flexible substrate here.

Figure 3B:
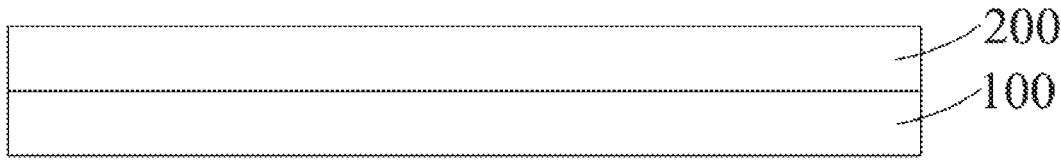

Step 2: manufacturing and forming an anode 200 on the substrate by referring to FIG. 3B. The anode 200 may be transparent or semi-transparent or non-transparent, which is determined according to a direction of light emission here. If the light is emitted from a side of a cathode 600, the anode 200 is non-transparent and may reflect the light; and if the light is emitted from a side of the anode 200, the anode 200 is transparent or semi-transparent.

Figure 3C:
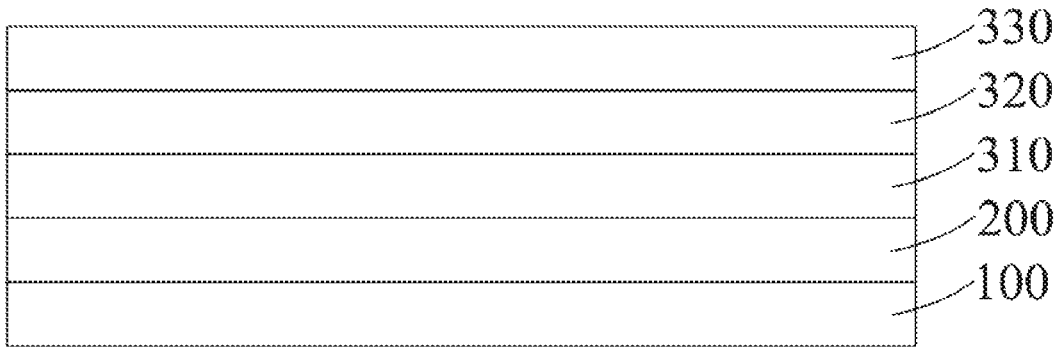

Step 3: manufacturing and forming three layers of hole transmission layers on the anode 200, which are a first hole transmission layer 310, a second hole transmission layer 320, and a third hole transmission layer 330 respectively from bottom to top, by referring to FIG. 3C. It should be explained that the number of layers of the hole transmission layers is not limited to three layers, and may further be two layers or more layers in the present disclosure.

The P-type doping is performed on the first hole transmission layer 310, the second hole transmission layer 320, and the third hole transmission layer 330, and doping concentrations of the first hole transmission layer 310, the second hole transmission layer 320 and the third hole transmission layer 330 sequentially increase along a direction away from the anode 200.

Furthermore, a manufacturing material of the first hole transmission layer 310, the second hole transmission layer 320, and the third hole transmission layer 330 may be polytetraphenylbenzidine or polyvinylcarbazole, for example, but the present disclosure not limited thereto. In addition, a doping material for performing a P-type doping may be such as F4-TCNQ (2,3,5,6-Tetrafluoro-7,7',8,8'-Tetracyanoquino-dimethane) or HAT-CN (2,3,6,7,10,11-Hexacyano-1,4,5,8,9,12-hexaazatriphenylene) or Molybdenum trioxide ($MoO_3$), but the present disclosure is not limited thereto.

Figure 3D:
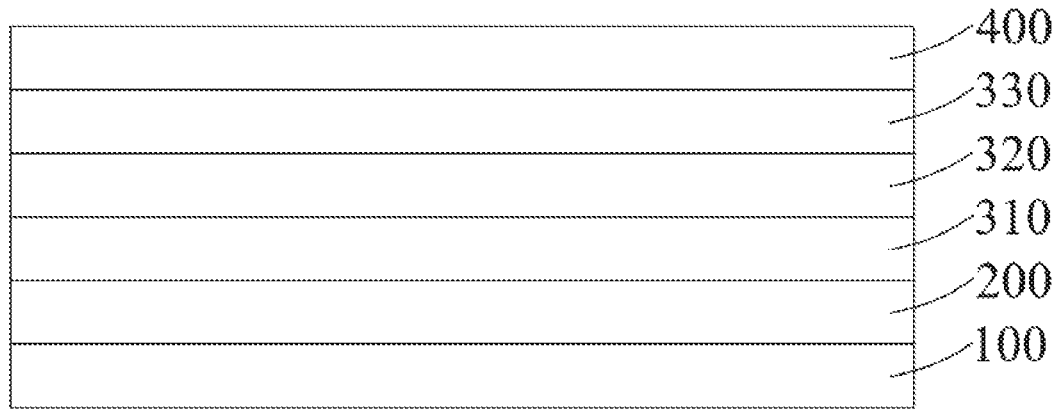

Step 4: manufacturing and forming a quantum dot luminescent layer 400 on the third hole transmission layer 330 by referring to FIG. 3D. The quantum dot luminescent layer 400 is used to generate and emit the light.

Figure 3E:
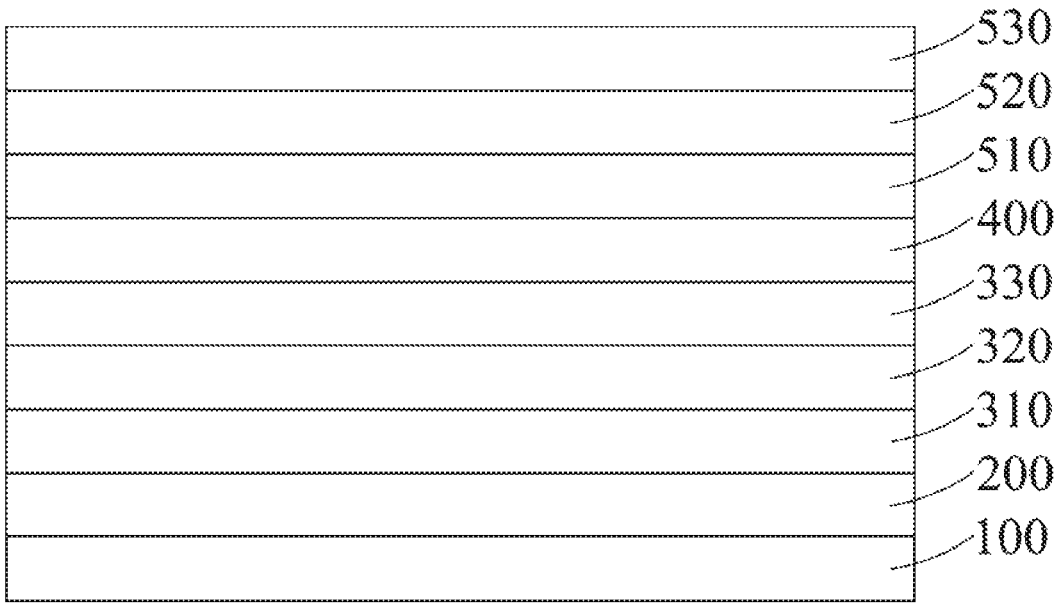

Step 5: manufacturing and forming three layers of electron transmission layers on the quantum dot luminescent layer 400, namely, a first electron transmission layer 510, a second electron transmission layer 520, and a third electron transmission layer 530 respectively from bottom to top by referring to FIG. 3E. It should be explained that the number of layers of the electron transmission layers is not limited to three layers, and may further be two layers or more layers in the present disclosure.

The N-type doping is performed on the first electron transmission layer 510, the second electron transmission layer 520, and the third electron transmission layer 530, and doping concentrations of the first electron transmission layer 510, the second electron transmission layer 520 and the third electron transmission layer 530 successively increase along a direction away from the quantum dot luminescent layer 400.

Figure 3F:
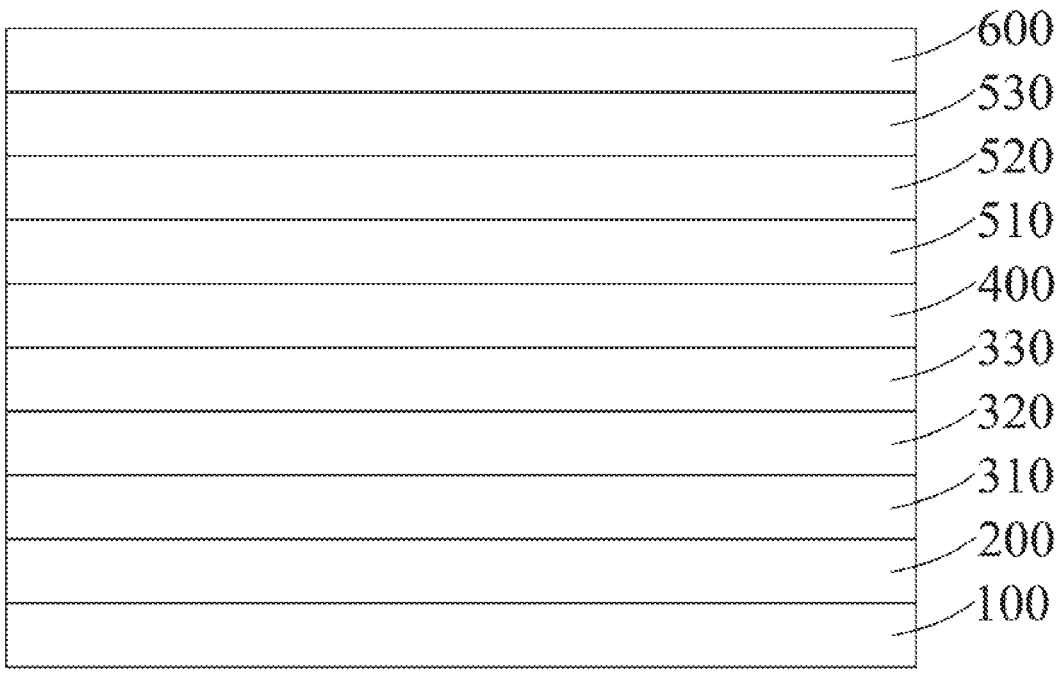

Step 6: manufacturing and forming a cathode 600 on the third electron transmission layer 530 by referring to FIG. 3F. The cathode 600 may be transparent or semi-transparent or non-transparent, which is determined according to the direction of light emission here. If the light is emitted from the side of the anode 200, the cathode 600 is non-transparent and may reflect the light; and if the light is emitted from the side of the cathode 600, the cathode 600 is transparent or semi-transparent.

Although the present disclosure is illustrated and described with reference to the specific embodiments, those skilled in the art will understand that: various changes in forms and details may be made therein without departing from the spirit and the scope of the present disclosure as defined by the claims and the equivalents thereof.

The invention claimed is:

1. A quantum dot electroluminescent device, comprising:
   a substrate;
   an anode disposed on the substrate;
   a hole transmission layer disposed on the anode;
   a quantum dot luminescent layer disposed on the hole transmission layer;
   an electron transmission layer disposed on the quantum dot luminescent layer; and
   a cathode disposed on the electron transmission layer,
   wherein the hole transmission layer is a P-type doped hole transmission layer, a number of layers of the hole transmission layer is at least two, and a doping concentration of the hole transmission layer gradually increases along a direction away from the anode.

2. The quantum dot electroluminescent device of claim 1, wherein the electron transmission layer is a N-type doped electron transmission layer, a number of layers of the electron transmission layer is at least two, and a doping concentration of the electron transmission layer gradually increases along the direction away from the anode.

3. The quantum dot electroluminescent device of claim 1, wherein a material of the hole transmission layer is polytetraphenylbenzidine or polyvinylcarbazole, and a P-type doped material in the hole transmission layer is F4-TCNQ (2,3,5,6-Tetrafluoro-7,7',8, 8'-Tetracyanoquino-dimethane) or HAT-CN (2,3,6,7,10,11-Hexacyano-1,4,5,8,9,12-hexaazatriphenylene) or $MoO_3$.

4. A quantum dot electroluminescent device, comprising:
a substrate;
an anode disposed on the substrate;
a hole transmission layer disposed on the anode;
a quantum dot luminescent layer disposed on the hole transmission layer;
an electron transmission layer disposed on the quantum dot luminescent layer; and
a cathode disposed on the electron transmission layer,
wherein the electron transmission layer is a N-type doped electron transmission layer, a number of layers of the electron transmission layer is at least two, and a doping concentration of the electron transmission layer gradually increases along a direction away from the anode.

* * * * *